United States Patent
Dean et al.

(10) Patent No.: US 7,434,310 B2
(45) Date of Patent: Oct. 14, 2008

(54) PROCESS TO REFORM A PLASTIC PACKAGED INTEGRATED CIRCUIT DIE

(75) Inventors: Timothy B. Dean, Elk Grove Village, IL (US); Bruce C. Deemer, Elk Grove Village, IL (US); Daniel T. Rooney, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 37 days.

(21) Appl. No.: 11/422,233

(22) Filed: Jun. 5, 2006

(65) Prior Publication Data

US 2007/0278676 A1  Dec. 6, 2007

(51) Int. Cl.
*H05K 3/02* (2006.01)

(52) U.S. Cl. .................. 29/847; 29/401.1; 29/843; 174/528; 257/666; 438/123; 438/459

(58) Field of Classification Search ................ 29/401.1, 29/832, 840, 841, 843, 846–848; 174/521, 174/528, 529, 536; 257/666, 676, 692, 737, 257/780; 438/106, 123, 124, 126, 459
See application file for complete search history.

(56) References Cited

U.S. PATENT DOCUMENTS

| 5,157,480 A * | 10/1992 | McShane et al. ............. 257/675 |
| 6,350,664 B1 * | 2/2002 | Haji et al. .................... 438/110 |
| 6,429,028 B1 | 8/2002 | Young |
| 6,548,328 B1 * | 4/2003 | Sakamoto et al. ............ 438/123 |

* cited by examiner

*Primary Examiner*—Donghai D. Nguyen
(74) *Attorney, Agent, or Firm*—James Lamb; Anthony P. Curtis

(57) ABSTRACT

A process for reforming a plastic packaged integrated circuit die (100) includes grinding away (305) a bottom side (210) of a plastic package (205) and portions of a set of leads (110) that are in the plane of the grinding until a bottom surface (240) of an inner portion (230) of the set of leads is exposed at a peripheral region (235) of the inner portion, cutting (310) approximately perpendicularly to the top and bottom sides to remove portions of the plastic package and the set of leads that are outside the inner portion of the set of leads, and adapting (320) the bottom surfaces of the inner portion of the set of leads for reliable electrical connections.

17 Claims, 2 Drawing Sheets

PROCESS TO REFORM A PLASTIC PACKAGED INTEGRATED CIRCUIT DIE

FIELD OF THE INVENTION

The present invention relates generally to integrated circuit packaging, and in particular to reforming an already fabricated integrated circuit.

BACKGROUND

Today there are available integrated circuits having complex and useful functionality that are economically available in standardized plastic packaging, and in some cases, in the form of integrated circuit die. For example, some integrated circuits are provided in plastic packages known as PLCC packages having 68 leads, that are approximately 24.23 millimeters square and 4.19 millimeters in height.

However, some applications to which these integrated circuits could be put to use demand a package size smaller than the standardized size in which they are economically available, but do not require large quantities, such as more than 100,000 pieces. Methods that can be used today to obtain an integrated circuit in a small package size include fabricating one from integrated circuit die and reforming a standardized plastic packaged integrated circuit by etching away portions of the plastic. Neither of these is very economical.

BRIEF DESCRIPTION OF THE FIGURES

The accompanying figures, where like reference numerals refer to identical, or functionally similar elements throughout the separate views, together with the detailed description below, are incorporated in and form part of the specification, and serve to further illustrate the embodiments and explain various principles and advantages, in accordance with the present invention.

Figure 1:
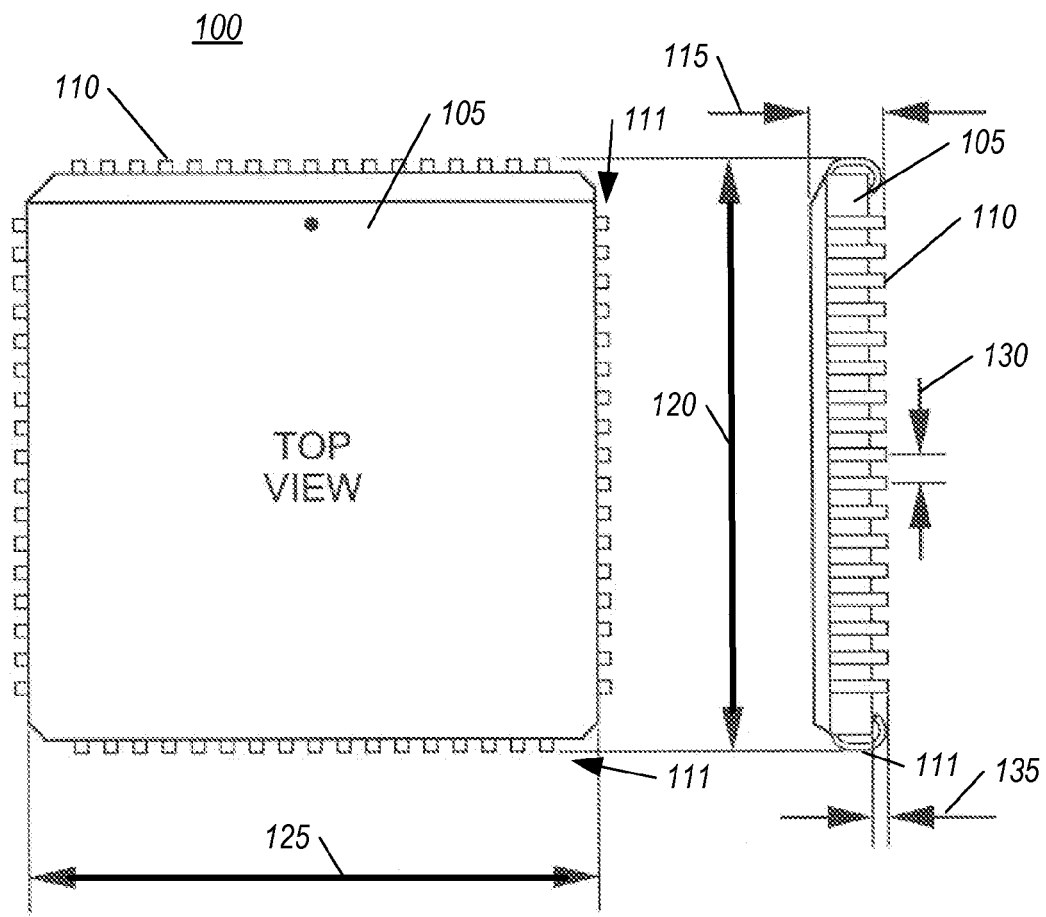
FIG. 1 is plan view of a plastic packaged integrated circuit die, in accordance with some embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to reforming a packaged integrated circuit to a smaller form factor. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Referring to FIG. 1, plan view of a plastic packaged integrated circuit die 100 is shown, in accordance with some embodiments of the present invention. The packaged integrated circuit 100 comprises an integrated circuit (not visible in FIG. 1) packaged in a plastic package 105 having a set of leads 110 used for interconnection to other electronic circuits. The plastic package in this example is an industry standard 68 pin plastic leaded chip carrier (PLCC), which is commonly used for microprocessors or other complex integrated circuits requiring a large number of pinouts. Although a 68 pin PLCC is described in these embodiments, it will become apparent in this document that the benefits that accrue for these embodiments also accrue to other size PLCC's and other types of plastic packaged integrated circuits. The 68 pin PLCC is a square plastic package having a height 115 of approximately 4.19 millimeters and a length 120 and width 125 that are approximately 24.23 millimeters. (The leads 110 make the total package size slightly larger.) The set of leads 110 has an exposed portion 111; i.e., that portion of the set of leads 110 that are outside the plastic package 105. The spacing 130 of the exposed portion 111 of the set of leads 110 is approximately 1.27 on centers, and the exposed portion of the set of leads extends 135 approximately 0.89 millimeters below the bottom surface of the plastic package.

Figure 2:
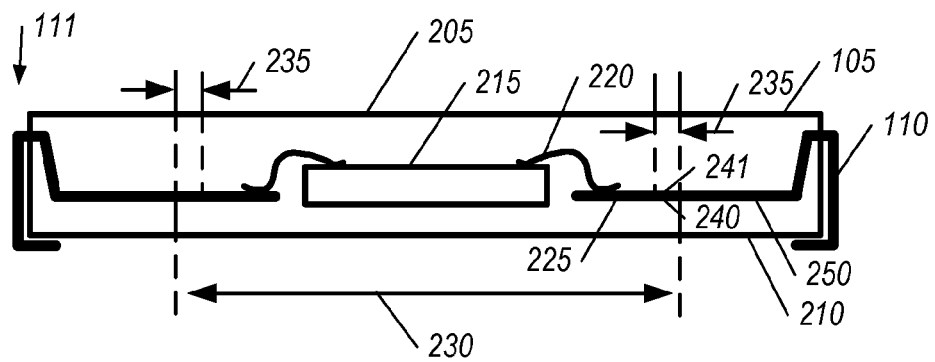
FIG. 2 is a cross sectional elevation view of the packaged integrated circuit die of FIG. 1, in accordance with some embodiments of the present invention.

Referring to FIG. 2, a cross sectional elevation view of the packaged integrated circuit die 100 is shown, in accordance with some embodiments of the present invention. FIG. 2 is not drawn to the same scale as FIG. 1, and the scale of FIG. 2 in the horizontal dimension is not necessarily the same as the scale in the vertical dimension. The integrated circuit die 215 may be connected to the set of leads 110 by a set of wire bonds 220 in a conventional manner. The set of leads has an inner portion 225 within the plastic package 105, which in this example is an approximately square region having a side dimension 230 and having a peripheral region 235. (There is also a portion of the set of leads that is between the exposed portion 111 and the inner portion.) The peripheral region 235 of the inner portion 225 of the set of leads 110 is approximately co-planar (i.e., the elevation of the set of leads in the peripheral region 235 of the inner portion 225 is approximately equal). The set of leads 110 has a bottom surface 240 and a top surface 241. In the example shown in FIG. 2, the entire inner portion 225 of the set of leads 110 is approximately coplanar, but this need not be the case in order to obtain the benefits described herein; the inner portion 225 of the set of leads (the portion in the inner portion 230 but not in the peripheral region 235) may be above (but not below) the co-planer portion that is the peripheral region 235. The portion 250 of the set of leads outside the inner portion may be at any elevation with reference to the elevation of the set of leads in the peripheral region 235. The plastic package 105 has a top side 205 and a bottom side 210.

Figure 3:
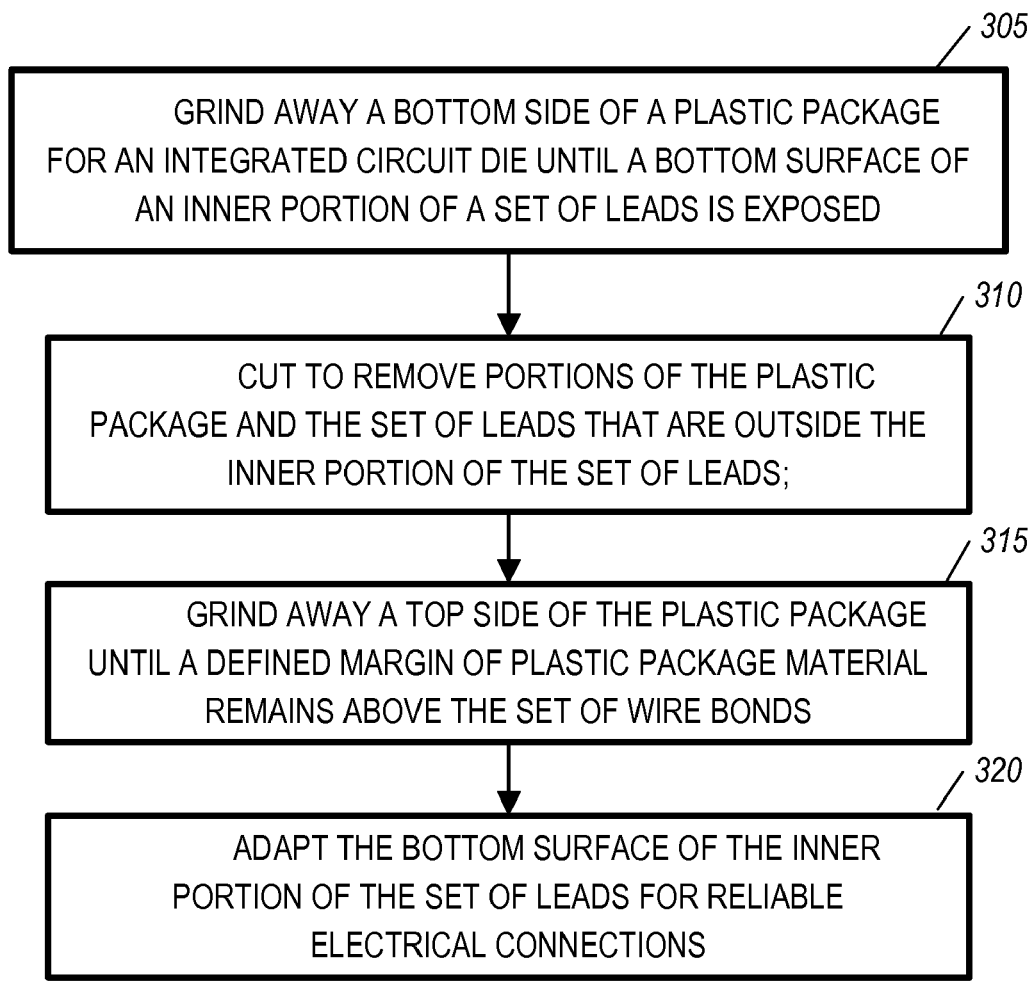
FIG. 3 is a flow chart that shows some steps of a method to reform an integrated circuit die that is packaged in a plastic package, in accordance with some embodiments of the present invention.
Figure 4:
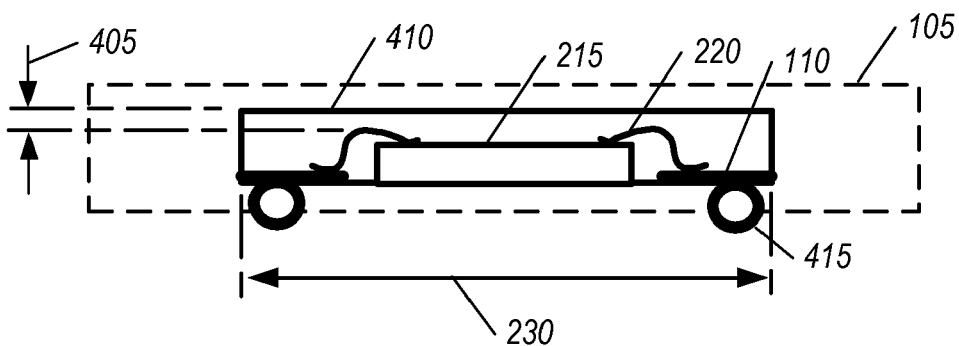
FIG. 4 is a cross sectional elevation view of the plastic packaged integrated circuit die after reforming, in accordance with some embodiments of the present invention.

Referring now to FIGS. 3 and 4, a flow chart in FIG. 3 shows some steps of a method to reform an integrated circuit die that is packaged in a plastic package, and a cross sectional elevation view of the packaged integrated circuit is shown in FIG. 4, in accordance with some embodiments of the present invention. The plastic package may be the 68 pin PLCC package shown in FIGS. 1 and 2, and has a set of leads that has exposed portions 111 extending out of the plastic package and an inner portion 230 that has a peripheral region 235 that is approximately co-planar.

At step 305, the bottom side 210 of the plastic package 105 and portions of the set of leads 110 that are in a plane of grinding are ground away until the bottom surface 240 of the inner portion of the set of leads 110 is exposed in the peripheral region 235 of the inner portion 230, as illustrated in FIG. 4. The bottom side 210 of the plastic package 105 and portions of the set of leads 110 that are in the plane of grinding are ground away in a plane that is approximately parallel to the bottom 210 of the plastic package 105. The portion of the set of leads 110 within the peripheral region 235 were described above as being approximately co-planar. Approximately co-planar in this context means that this portion is co-planar to an extent such that a minimum elevation distance exists between a highest point of the bottom surface 240 and a lowest portion of the top surface 241 of the leads. This minimum distance may be determined by a number of factors, such as the largest amount of current that will be carried by any one of the leads under extreme specified conditions, the maximum amount by which the grinding may be non-parallel to the bottom side 210 of the plastic package under normal process variations, and the roughness of the grinding, and may be, for example, 50 microns. This is not a constraint that prevents typical plastic packaged integrated circuits to be processed according to the methods described herein. In some embodiments, a bottom surface of the integrated circuit die 215 may be lower in elevation than the bottom surface 240 of the portion of the set of leads 110 in the peripheral portion 235, and a portion of the integrated circuit may be ground away. In these embodiments, the bottom surface of the integrated circuit die 215 is not electrically active.

At step 310, the plastic package 105 is cut approximately perpendicularly to the top and bottom sides of the plastic package to remove those portions of the plastic package and the set of leads that are outside the inner portion of the set of leads. Such cutting can be performed, for example, using a saw or a laser.

In some embodiments, the top side of the package is ground away at step 315 until a defined margin 405 (FIG. 4) of plastic package material remains above a top surface of the set of wire bonds 220. The defined margin may be determined by a number of factors, such as a maximum amount by which the grinding may be non-parallel to the top side 205 of the plastic package 105 under normal process variations and the roughness of the grinding, and may be, for example, 50 microns. In some embodiments the amount of package height reduction available from this step is not sufficient to justify this step, and it is not performed. After step 315 is completed, or in some embodiments, after step 310 is completed, a reformed plastic package 410 remains, which in FIG. 4 is illustrated for the case in which step 315 is performed.

At step 320, the bottom surfaces of the inner portion of the set of leads are adapted for reliable electrical connections to conductors on a substrate or other electronic device. Examples of methods that may be used to achieve the adaptation are electrically attaching a lead frame to the inner portion of the set of leads, plating the inner portion of the lead frame, and forming a ball grid array on the inner portion of the lead frame. FIG. 4 illustrates balls 415 of a ball grid array. After step 320, the reforming of the plastic packaged integrated circuit may be complete.

In the case of the 68 pin PLCC plastic described herein above, the plastic package outline may be reduced from a nominal size of 24.23×24.23 millimeters, or approximately 587 square millimeters to 16.00×16.00 millimeters, or approximately 256 square millimeters, which is approximately 44% of its starting size. Thus, it can be seen that the embodiments described above can achieve a considerable size reduction of a plastic packaged integrated circuit at a cost that is very effective for production of certain types of electronic devices in appropriate quantities.

It will be appreciated that when those steps that precede step 320 (which have been described above with reference to FIG. 3) are completed, a plastic packaged integrated circuit has been fabricated that includes an integrated circuit die having wire bond pads on a wire bond side of the integrated circuit die, a set of leads having a planar portion in the peripheral region of the inner portion of the set of leads (which is now a peripheral region of the plastic package), a plurality of wire bonds connecting at least a portion of the wire bond pads to a top side of the planar set of leads, and a plastic package. The plastic package encapsulates the wire bonds, the wire bond side and edges of the integrated circuit die, and the top side and edges of the planar set of leads, such that the planar set of leads are embedded in the plastic package with a bottom side of the planar portion of the set of leads being exposed.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A process to reform a plastic packaged integrated circuit die into a smaller plastic packaged integrated circuit die, comprising:

providing a plastic packaged integrated circuit die containing an integrated circuit die connected by a set of wire bonds to a set of leads, and the integrated circuit die, the set of wire bonds and a portion of the set of lead encased in a plastic package, the plastic packaged integrated circuit die provided as a chip carrier having a portion of the set of leads extending from a surface of the chip carrier; and reforming the provided plastic packaged integrated circuit die, the reforming comprising:

grinding away a bottom side of the plastic package and portions of the set of leads that are in the plane of the grinding until a bottom surface of an inner portion of the set of leads is exposed at a peripheral region of the inner portion;

cutting approximately perpendicularly to the top and bottom sides of the plastic package to remove portions of the plastic package and the set of leads that are outside the inner portion of the set of leads; and adapting the bottom surfaces of the inner portion of the set of leads to create reliable electrical connections.

2. The process according to claim 1, further comprising: grinding away a top side of the plastic package until a defined margin of plastic package material remains above a top surface of the set of wire bonds.

3. The process according to claim 1, wherein the adapting of the bottom surfaces of the inner portion of the set of leads comprises electrically attaching a lead frame to the inner portion of the set of leads.

4. The process according to claim 3, wherein the adapting further comprises plating an inner portion of the lead frame.

5. The process according to claim 4, wherein the adapting further comprises forming a ball grid array on the inner portion of the lead frame.

6. The process according to claim 1, wherein the inner portion of the set of leads in the peripheral region within the plastic package is approximately co-planar.

7. The process according to claim 1, wherein the plastic package is standardized plastic packaging.

8. The process according to claim 7, wherein the plastic package is a plastic leaded chip carrier (PLCC).

9. A process to reform a plastic packaged integrated circuit die into a smaller plastic packaged integrated circuit die, comprising:

providing a plastic packaged integrated circuit die containing integrated circuit die connected by wire bonds to leads, and the integrated circuit die, the wire bonds and a portion of leads encapsulated in a standard plastic package as a chip, each lead having an inner portion within the package and an outer portion extending from the inner portion to outside the package, the inner portion disposed in an inner region and a peripheral region, the peripheral region more proximate to the outer portion than the inner region is to the outer portion, the outer portion disposed in an outer region; and reforming the provided plastic packaged integrated circuit die, the reforming comprising:

grinding away a bottom side of the standard plastic package to expose bottom surfaces of inner portions of the leads;

cutting approximately perpendicularly to top and bottom sides of the package to cut through plastic package material and the leads and remove portions of the package material in the outer region and the outer portions of the leads; and adapting the bottom surfaces of the inner portions of the leads to create reliable electrical connections.

10. The process according to claim 9, wherein the inner portion of the leads in the peripheral region is co-planar with at least some of the outer portion of the leads.

11. The process according to claim 9, wherein the inner portions of the leads are wholly encapsulated by the package material prior to the grinding away.

12. The process according to claim 9, further comprising grinding away a top side of the package until a defined margin of the package material remains above a top surface of the wire bonds.

13. The process according to claim 9, wherein the adapting comprises electrically attaching a lead frame to the inner portions of the leads.

14. The process according to claim 13, wherein the adapting further comprises plating an inner portion of the lead frame.

15. The process according to claim 14, wherein the adapting further comprises forming a ball grid array on the inner portion of the lead frame.

16. The process according to claim 9, wherein the inner portions of the leads in the peripheral region are approximately co-planar.

17. The process according to claim 9, wherein the package is a plastic leaded chip carrier (PLCC) package.

* * * * *